United States Patent
Wu (10) Patent No.: US 8,738,311 B2
(45) Date of Patent: May 27, 2014

(54) STATE-OF-CHARGE ESTIMATION METHOD AND BATTERY CONTROL UNIT

(75) Inventor: Chien-Hsun Wu, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 357 days.

(21) Appl. No.: 13/106,305

(22) Filed: May 12, 2011

(65) Prior Publication Data

US 2012/0143542 A1 Jun. 7, 2012

(30) Foreign Application Priority Data

Dec. 2, 2010 (TW) ................................ 99141981 A (51) Int. Cl.
*G01R 31/36* (2006.01)

(52) U.S. Cl.
USPC .................. 702/63; 702/58; 702/64; 702/79; 702/108

(58) Field of Classification Search
USPC .................. 702/58, 63, 64, 79, 108; 700/297; 340/636.1, 636.21; 324/145, 426; 320/127
See application file for complete search history.

(56) References Cited

U.S. PATENT DOCUMENTS

| | | | |
|---|---|---|---|
| 6,011,379 A * | 1/2000 | Singh et al. .................. 320/132 |
| 6,356,083 B1 | 3/2002 | Ying |
| 6,359,419 B1 | 3/2002 | Verbrugge et al. |
| 6,366,054 B1 | 4/2002 | Hoenig et al. |
| 6,529,840 B1 | 3/2003 | Hing |
| 6,774,636 B2 | 8/2004 | Guiheen et al. |
| 6,850,038 B2 | 2/2005 | Arai et al. |
| 7,352,156 B2 | 4/2008 | Ashizawa et al. |
| 7,649,338 B2 | 1/2010 | Seo et al. |
| 2004/0119445 A1 | 6/2004 | Wakeman |
| 2005/0017685 A1 | 1/2005 | Rees et al. |
| 2005/0269991 A1 | 12/2005 | Mitsui et al. |
| 2006/0022677 A1 | 2/2006 | Patino |
| 2007/0299620 A1 | 12/2007 | Yun et al. |
| 2009/0001992 A1 | 1/2009 | Tsuchiya |

FOREIGN PATENT DOCUMENTS

CN 101813754 8/2010

(Continued)

OTHER PUBLICATIONS

Bhangu, B.S. et al., "Observer techniques for estimating the State-of-Charge and State-of-Health of VRLABs for Hybrid Electric Vehicles", IEEE, 2005, pp. 780-789.

(Continued)

*Primary Examiner* — Elias Desta
(74) *Attorney, Agent, or Firm* — Muncy, Geissler, Olds & Lowe, P.C.

(57) ABSTRACT

A SOC (state of charge) estimation method for a rechargeable battery includes: measuring a battery parameter of the rechargeable battery; judging whether the battery parameter of the rechargeable battery is stable; if the battery parameter of the rechargeable battery is not stable yet, estimating an open circuit voltage of the rechargeable battery by a fuzzy control and expanding an established experiment data of the rechargeable battery into a 3D function by the fuzzy control; and calculating a time domain dynamic equation and converting into a SOC function, substituting the SOC function into the fuzzy control to estimate an SOC estimation value, wherein the time domain dynamic equation performing a time domain dynamic monitor.

9 Claims, 8 Drawing Sheets

(56) References Cited

FOREIGN PATENT DOCUMENTS

| | | | |
|---|---|---|---|
| EP | 1896924 | A1 | 3/2008 |
| GB | 2176902 | A * | 1/1987 |
| JP | 2009519468 | | 5/2009 |
| JP | 2009619468 | | 5/2009 |
| TW | 451512 | | 8/2001 |
| TW | I268637 | | 12/2006 |
| TW | I287313 | | 9/2007 |
| TW | I320977 | | 2/2010 |
| TW | 201021350 | | 6/2010 |
| TW | M392770 | | 11/2010 |

OTHER PUBLICATIONS

Ran, Li et al., "Prediction of State of Charge of Lithium-ion Rechargeable Battery with Electrochemical Impedance Spectroscopy Theory", IEEE, 2010, pp. 684-688.

Li, I-Hsum et al., "A Merged Fuzzy Neural Network and Its Applications in Battery State-of-Charge Estimation", IEEE, 2007, pp. 697-708.

Bree, Patrick J. van et al., "Prediction of Battery Behavior Subject to High-Rate Partial State of Charge", IEEE, 2009, pp. 588-595.

* cited by examiner

STATE-OF-CHARGE ESTIMATION METHOD AND BATTERY CONTROL UNIT

This application claims the benefit of Taiwan application Serial No. 099141981, filed Dec. 2, 2010, the subject matter of which is incorporated herein by reference.

TECHNICAL FIELD

The disclosure relates in general to a SOC (state of charge) estimation method and a battery control unit applying the same.

BACKGROUND

Due to Environment Protection, consumers have attention on electric vehicles. In general, electric vehicle includes hybrid electric vehicle (HEV), plug-in hybrid electric vehicle (PHEV or PHV) and battery electric vehicle (BEV). NiMH rechargeable battery is widely applied in HEV because its safety and reliability. But NiMH rechargeable battery has disadvantages, such as small energy storage, large size and battery memory effect. Lithium (Li) ion rechargeable battery has advantages, such as light weight, high energy storage, less self-charge, no battery memory effect and more charge/discharge cycles. Li ion rechargeable battery has potential to replace NiMH rechargeable battery in electric vehicle applications.

Li ion rechargeable battery has high energy density and therefore its safety is an issue. If over-charged, the temperature of the Li ion rechargeable battery is raised and the energy stored therein is too much. Electrolytic solution is decomposed into gas. Its internal atmospheric pressure is higher and the Li ion rechargeable battery will be spontaneous ignition or broken. The estimation of SOC (state of charge) for the rechargeable battery is important.

BRIEF SUMMARY

Embodiments of the disclosure provides a SOC (state of charge) estimation method for a rechargeable battery and a battery control unit for controlling a rechargeable battery, which integrates a fuzzy theory, an improved Coulomb detection and an OCV (open circuit voltage) to estimate SOC and SOH (state of health).

An exemplary embodiment of the disclosure provides a SOC (state of charge) estimation method for a rechargeable battery, applied in a battery management system of an electronic vehicle, including: measuring a battery parameter of the rechargeable battery; judging whether the battery parameter of the rechargeable battery is stable; if the battery parameter of the rechargeable battery is not stable, estimating a battery open circuit voltage of the rechargeable battery by a fuzzy control and processing an established experiment data of the rechargeable battery into a 3D function by the fuzzy control; and calculating a time domain dynamic equation and converting into a SOC function, substituting the SOC function into the fuzzy control to estimate an SOC value, wherein the time domain dynamic equation performing a time domain dynamic monitor.

Another exemplary embodiment of the disclosure provides a battery control unit for controlling a rechargeable battery, the battery control unit applied in a battery management system of an electronic vehicle, the battery control unit including: an interface circuit, receiving a battery voltage and a battery temperature of the rechargeable battery; a current measurement circuit, measuring a battery current of the rechargeable battery; and a processing circuit, coupled to the interface circuit, estimating a SOC value of the rechargeable battery based on the battery voltage, the battery temperature and the battery temperature of the rechargeable battery, if the processing circuit judging the battery voltage, the battery temperature and/or the battery temperature of the rechargeable battery is not stable, the processing circuit estimating a battery open circuit voltage of the rechargeable battery by a fuzzy control and processing an established experiment data of the rechargeable battery into a 3D function by the fuzzy control, the processing circuit calculating a time domain dynamic equation and converting into a SOC function, substituting the SOC function into the fuzzy control to estimate an SOC value, wherein the processing circuit performs a time domain dynamic monitor based on the time domain dynamic equation.

It is to be understood that both the foregoing general description and the following detailed description are exemplary and explanatory only and are not restrictive of the disclosed embodiments, as claimed.

DETAILED DESCRIPTION OF THE DISCLOSURE

Figure 1:
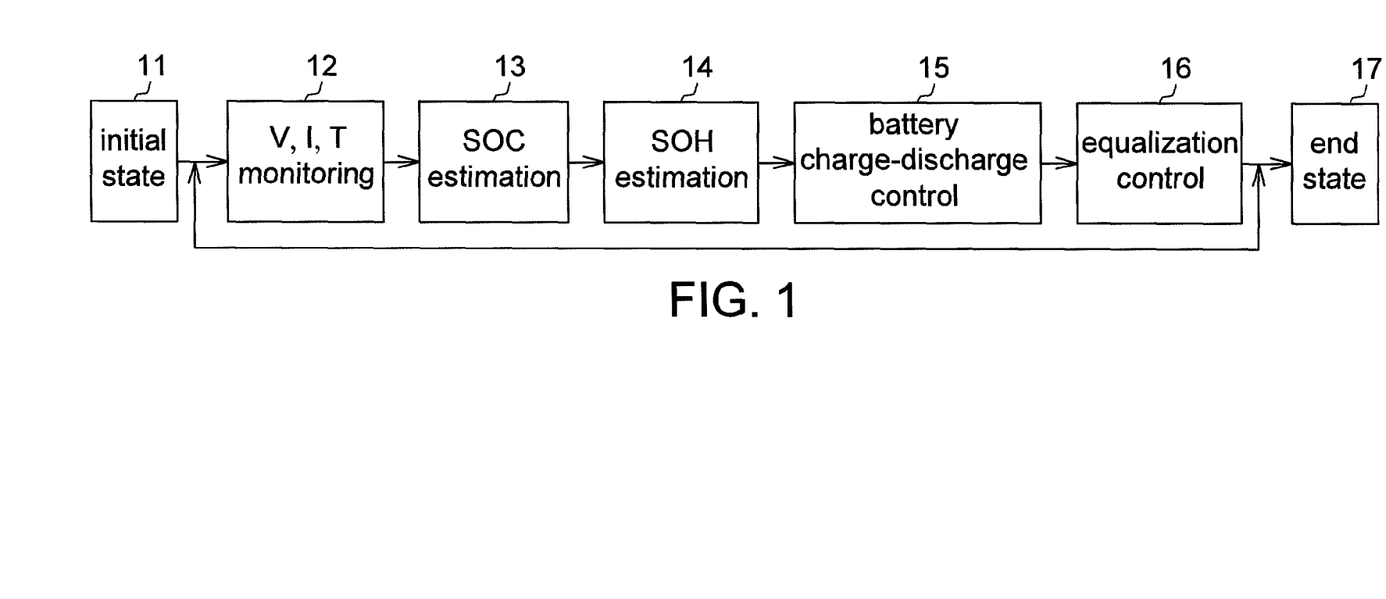
FIG. 1 shows a battery management system (BMS) of an exemplary embodiment of the disclosure.

Referring to FIG. 1, a battery management system (BMS) is shown. BMS is applied for example but not limited by on electronic vehicles. In an embodiment of the disclosure, BMS is embodied by for example but not limited SW, HW or FW.

Please refer to FIG. 1. In an initial state 11 before the electronic vehicle is started, a voltage (V), a current (I) and a temperature (T) of a rechargeable battery are monitored to estimate a SOC 13 of the rechargeable battery. A SOH (state of health) 14 of the rechargeable battery is estimated based on the SOC 13. Based the SOC 13 and the SOH 14, the BMS decides a battery charge-discharge control 15 and an equalization control 16. So, batteries in the battery module may be operated under allowable operation condition. If the electronic vehicle is turned off, the BMS enters into an end state 17.

In the BMS configuration, the SOC estimation and the SOH estimation are important and the SOC estimation plays an important role in the SOH estimation. For SOC estimation, the embodiment of the disclosure applies for example fuzzy control, an improved Coulomb detection and an OCV (open circuit voltage).

Figure 2:
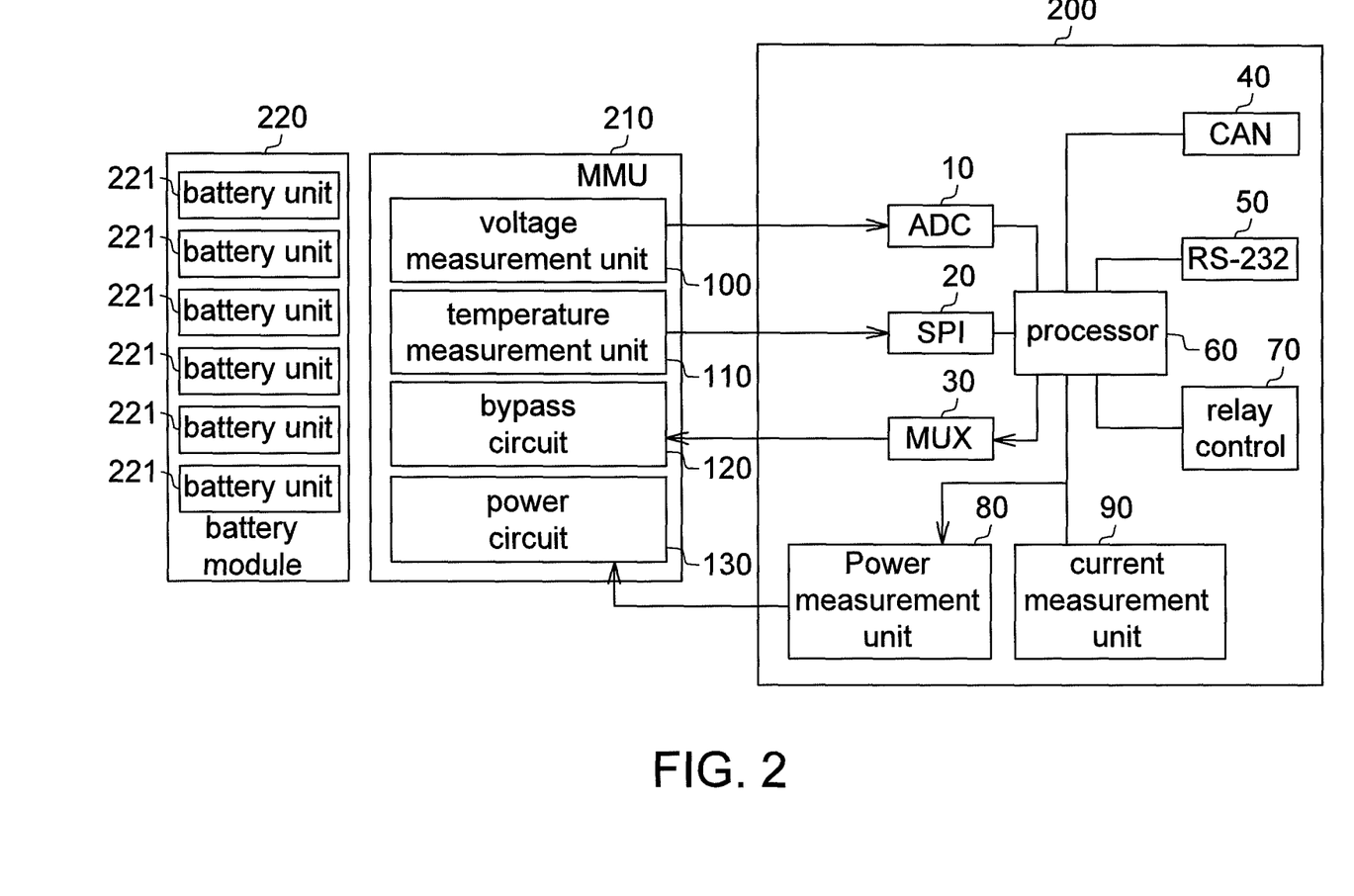
FIG. 2 shows a battery control unit (BCU) according to the embodiment of the disclosure.

Now please refer to FIG. 2 which shows a battery control unit (BCU) according to the embodiment of the disclosure. The hardware configuration in FIG. 2 may be applied in the BMS in FIG. 1. As shown in FIG. 2, the BCU 200 includes an ADC (analog digital converter) 10, a SPI (serial peripheral interface) 20, a multiplexer (MUX) 30, a CAN (controller area network) 40, a RS232 50, a processor 60, a relay control 70, a power measurement unit 80 and a current measurement unit 90. The BCU 200 measures battery voltage, battery temperature, battery voltage, battery module voltage and battery module current of the battery module. The BCU 200 further performs protection such as charge calculation and voltage equalization. The BCU 200 further performs I/O control. The MMU (module management unit) 210 includes a voltage measurement unit 100, a temperature measurement unit 110, a bypass circuit 120 and a power circuit 130. In FIG. 2, the battery module 220 includes 6 battery units 221, but the disclosure is not limited thereby. In practice, the BCU 200 may manage up to for example but not limited 8 battery modules (48 battery units in total) at the same time.

The voltage measurement unit 100 and the temperature measurement unit 110 respective measure the battery voltages and the battery temperatures of the battery units 221. The current measurement unit 90 measures an output battery current from the whole battery module 220 because the battery units may be connected in serial.

The bypass circuit 120 is controlled by the MUX 130. If the processor 60 detects one or some battery units as abnormal, the processor 60 outputs a control signal to the MUX 30 and the MUX 30 controls the bypass circuit 120 to discharge the abnormal battery unit(s), so as to maintain voltages of the battery units 221 equal.

If the battery module 220 is abnormal, the power circuit 130, controlled by the power measurement unit 80, shuts down power supplied to the battery module 220 to protect the battery module 220.

The ADC 10 converts the analog battery voltage signal from the MMU 210 into a digital signal to send to the processor 60 for SOC estimation. The ADC 10 uses for example precision measuring instrument amplifier stage and a voltage measurement error is within 20 mV. For example, if the battery module 220 includes 6 battery units 221, then there are 6 signal lines between the voltage measurement unit 100 and the ADC 10 for sending the respective battery voltage from the 6 battery units.

Via the SPI 20, the digital I/O pins of the BCU 200 are controlled by a sync clock for simplifying and shrinking PCB layout of the BCU 200. The battery temperature output from the temperature measurement unit 110 is sent to the processor 60 via the SPI 20. For example, at a sample timing, the temperature measurement unit 110 samples a temperature of a battery unit 221 and sends to the SPI 20; at another sample timing, the temperature measurement unit 110 samples a temperature of another battery unit 221 and sends to the SPI 20, and so on.

The MUX 30 controls the bypass circuit 120. Because the BCU 200 processes a plurality of measurement signals, via switching from the ADC 10 and the MUC 30, fewer measurement signal lines are enough for real-time procession on the measurement signals.

Via the CAN 40 and the RS232 50, the processor 60 provides communication and detection function between the BCU 200 and the external environment.

The processor 60 estimates the SOC and the SOH based on the battery voltages, the battery currents and the battery temperatures. The details of the estimation of SOC by the processor 60 are described later. Based on the SOC estimation, the battery voltages, the battery currents and the battery temperatures, the processor 60 judges whether to trigger alert. For example, the alert may indicate insufficient battery power, over-voltage or over-current.

The relay control 70 triggers or shuts down a safety protection on the battery module based on the battery status judgment from the processor 60.

The power measurement unit 80 controls the power circuit 130. If the processor 60 judges that the battery module 220 is abnormal, the processor 60 sends a control signal to the power measurement unit 80. The power measurement unit 80 sends a control signal to the power circuit 130 and the power circuit 130 shuts down power supplied to the battery module 220 for keeping from danger.

The current measurement unit 90 measures the battery current from the battery unit and its data refresh rate is for example but not limited 10 times/second.

Because the battery module 220 is designed in module, it is possible to add or reduce the number of the battery units in the battery module 220 and to maintain/fix.

Figure 3:
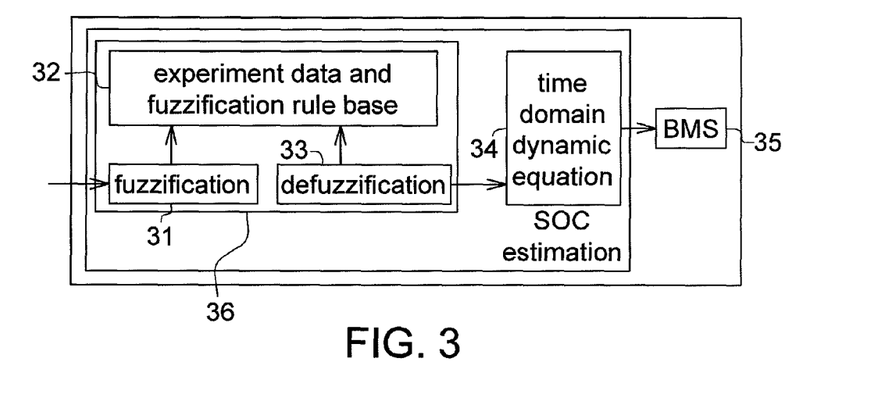
FIG. 3 shows a software system of the processor according to the embodiment of the disclosure.

Now please refer to FIG. 3, which shows a software system of the processor 60 according to the embodiment of the disclosure. As shown in FIG. 3, the processor 60 receives the current measurement signals (for example from the current measurement unit 90), the voltage measurement signals (for example from the voltage measurement unit 100) and the temperature measurement signals (for example from the temperature measurement unit 110) to calculate a battery OCV (open circuit voltage) relationship.

The SOC estimation 36 (for example but not limited by SW) in the processor 60 performs fuzzification 31, a pre-procession, on the received current measurement signals, the voltage measurement signals and the temperature measurement signals based on a membership function.

Further, in the disclosed embodiment, basic rules are established based on pre-measured battery experiment data and accordingly, the fuzzification rule base may be established even without or with complete experiment data. In the disclosed embodiment, based on the fuzzification rule base 32 and the membership function (which implies weighted parameters of the experiment data), a defuzzification 33 is performed on the fuzzified measurement signals. In here, the fuzzification 31, the fuzzification rule base 32 and the defuzzification 33 are referred as a fuzzy control.

A time domain dynamic equation 34 is calculated based on first-order battery electric characteristics and is converted into a SOC relationship. The time domain dynamic equation 34 performs time domain dynamic monitoring. If the battery OCV is substituted into the SOC relationship, the current battery capacitance is estimated and so is the SOS value. The details are described later. The estimated SOC value may be fed back to the BMS 35 for further application.

Figure 4:
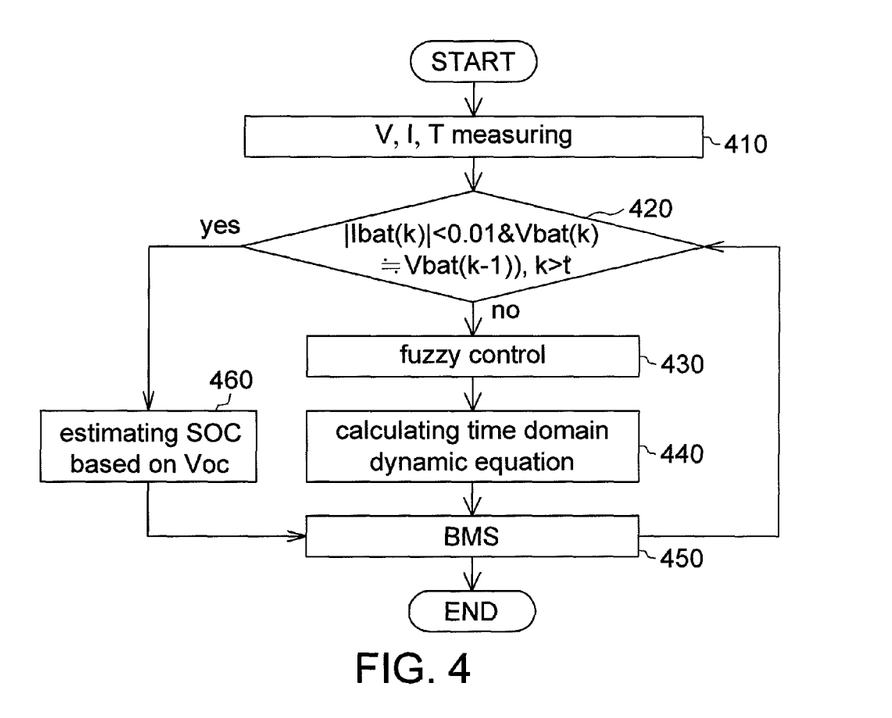
FIG. 4 shows a SOC estimation flowchart according to the embodiment of the disclosure.
Figures 5A, 5B:
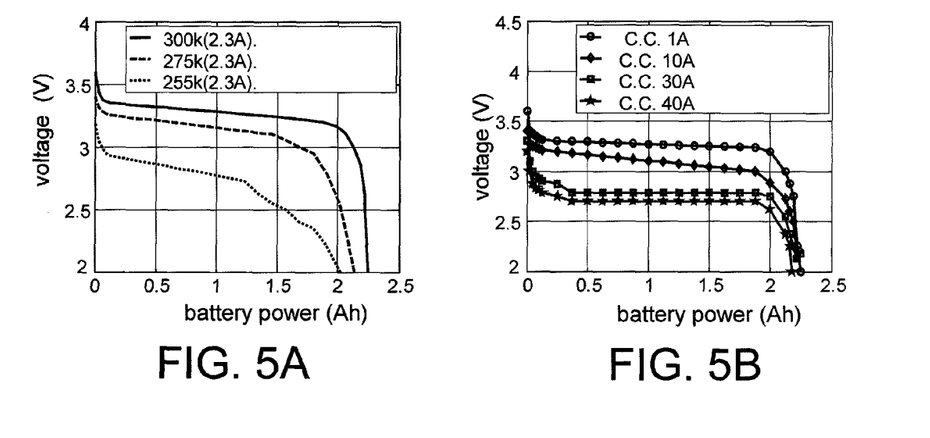
FIG. 5A shows a relationship between the battery voltage and the battery power storage under different temperatures in battery discharge test.
FIG. 5B shows a relationship between the battery voltage and the battery power storage under different currents in battery discharge test.
Figure 6A:
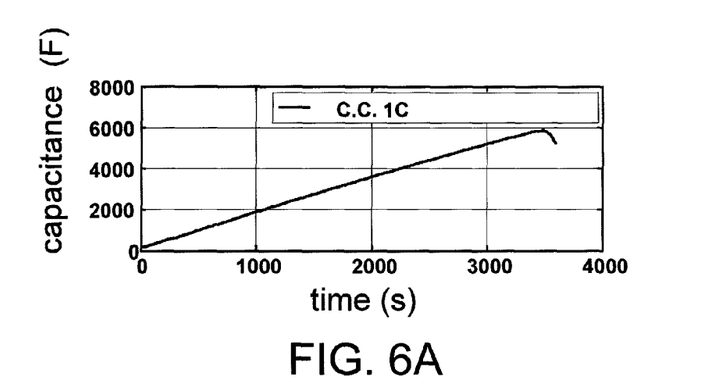
FIG. 6A shows a simulation of the battery capacitance in case of the load discharge current is 1 C.
Figure 6B:
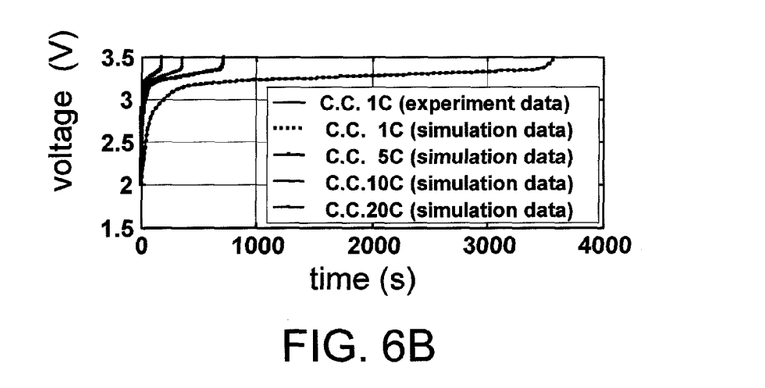
FIG. 6B shows a simulation and experiment data of the battery voltage under different load discharge currents, which shows a experiment data (1 C) and four simulation data (1 C, 5 C, 10 C and 20 C).

FIG. 4 shows a SOC estimation flowchart according to the embodiment of the disclosure. FIG. 5A shows a relationship between the battery voltage and the battery power storage under different temperatures in battery discharge test. FIG. 5B shows a relationship between the battery voltage and the battery power storage under different currents in battery discharge test. FIG. 6A shows a simulation of the battery capacitance in case of the load discharge current is 1 C. FIG. 6B shows a simulation and experiment data of the battery voltage under different load discharge currents, which shows a experiment data (1 C) and four simulation data (1 C, 5 C, 10 C and 20 C).

Now please refer to FIG. 4, FIG. 5A~FIG. 6B. In the disclosed embodiment, before SOC estimation, a charge-discharge test is performed on the battery unit for establishing SOC curves under different temperatures for defining the conversion relationship between the SOC and the OCV, as shown in FIG. 5A and FIG. 5B.

As shown in the step 410, after the system is initiated, the battery voltage (V), the battery current (I) and the battery temperature (T) are measured, for example by the voltage measurement unit, the current measurement unit and the temperature measurement unit of FIG. 2. In the step 420, during a predetermined period t, if the current variation and the voltage variation is small enough (($|Ibat(k)|<0.01$ and Vbat (k)☐Vbat(k−1)), an OCV estimation is performed for correcting the SOC initial value. The k of Ibat (k) and Vbat (k) represents the time of the battery current (I) and battery voltage (V). Furthermore, during a predetermined period t, judging whether the battery current of the rechargeable battery is smaller than a predetermined value (0.01) and the battery voltage of the rechargeable battery is stable, however, the battery parameter of the rechargeable battery is stable, as shown in the step 460.

On the contrary, if the stable periods for the battery current and the battery voltage are not longer than the predetermined period t, then the step 430 is performed. In practice, t is for example but not limited to 600 seconds. In the embodiment, if the stable periods for the battery current and the battery voltage are not longer than the predetermined period t, the SOC is estimated by the fuzzy control and the time domain dynamic equation (i.e. the improved Coulomb detection) because in this situation, Vbat is not equal to Voc (Voc is the battery open voltage) and it is not possible to detect the current VOC. So, the current VOC is estimated.

In the step 430, the battery open voltage Voc is estimated by the fuzzy control; and the fuzzy control is performed on the pre-established current experiment data, the pre-established voltage experiment data and pre-established temperature experiment data (as shown in FIGS. 5A and 5B) into 3D functions for obtaining the relationship between the battery Voc estimation and the input variables (the current, the voltage and the temperature). In the step 440, based on the improved Coulomb detection and the first-order battery equivalent circuit, the time domain dynamic equation is calculated and converted into the SOC relationship for establishing SOC estimation relationship. The simulation and experiment data of the SOC is shown in FIGS. 6A and 6B. The established SOC estimation relationship is substituted into the result obtained by the fuzzy control to obtain the SOC estimation value.

The obtained SOC estimation value may be fed to the BMS, as a judgment factor for the SOH and the safety protection, as shown in the step 450.

In the step 460, the stable periods for the battery current and the battery voltage are longer than the predetermined period t, the embodiment applies OCV detection to estimate the SOC. For example, the battery unit is under charge-discharge test to establish the SOC curves under different temperatures, for defining the conversion relationship between SOC and OCV, as shown in FIGS. 5A and 5B. In the case that the stable periods for the battery current and the battery voltage are longer than the predetermined period t, the SOC is estimated based on the established SOC curve or by lookup table.

Figure 7:
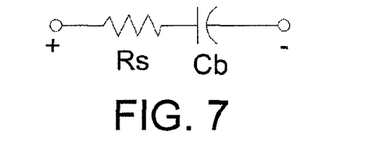
FIG. 7 shows a first order equivalent circuit for the rechargeable battery.

Now, how to estimate SOC is described. FIG. 7 shows a first order equivalent circuit for the rechargeable battery. If calculated by a first order RC circuit, the battery voltage Vbat is expressed as:

$$V_{bat} = V_{C,bat} + V_{S,bat} \quad (1)$$

Figure 8A:
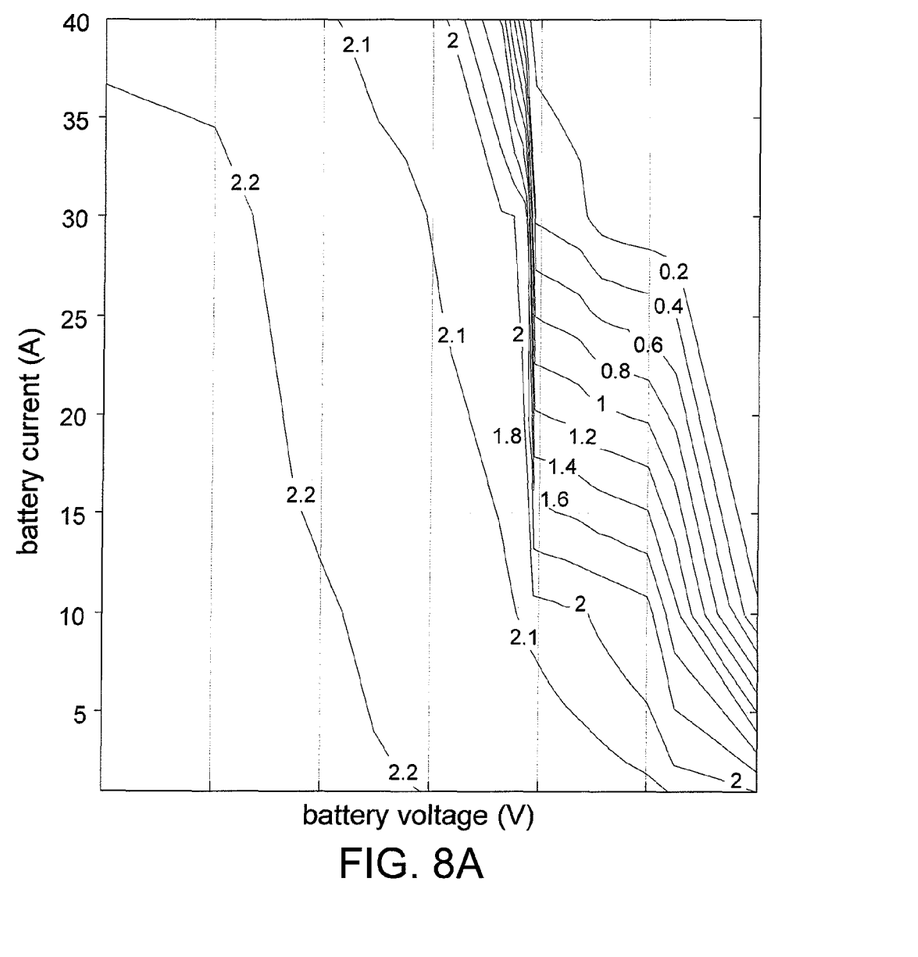
FIG. 8A~8C show the relationship between the battery voltage and the battery current at different battery power (0.2~2.2) under 300° K, 275° K and 255° K, respectively.
Figure 8B:
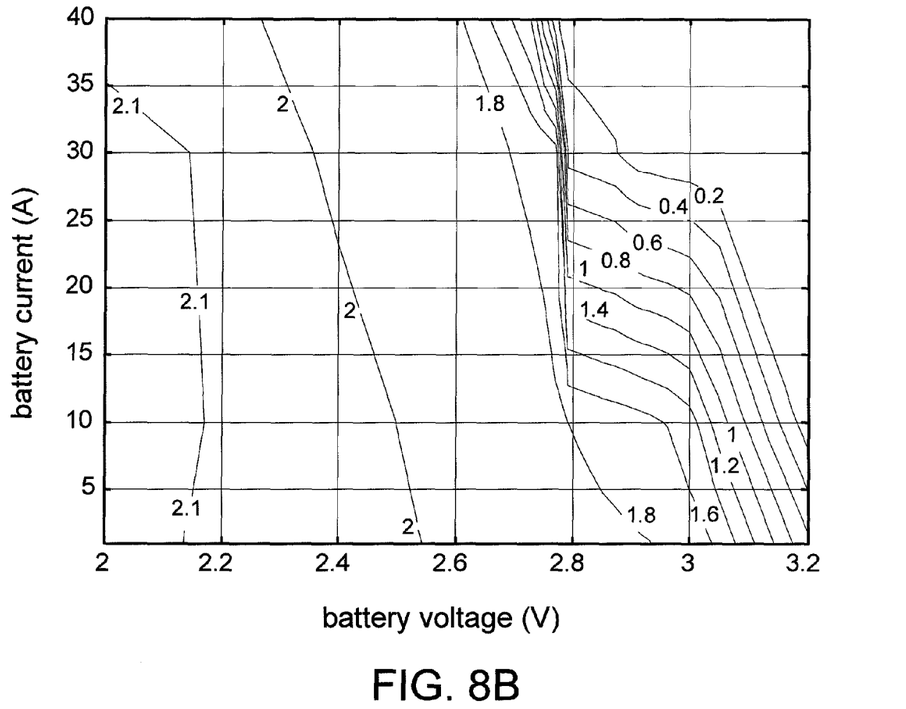
Figure 8C:
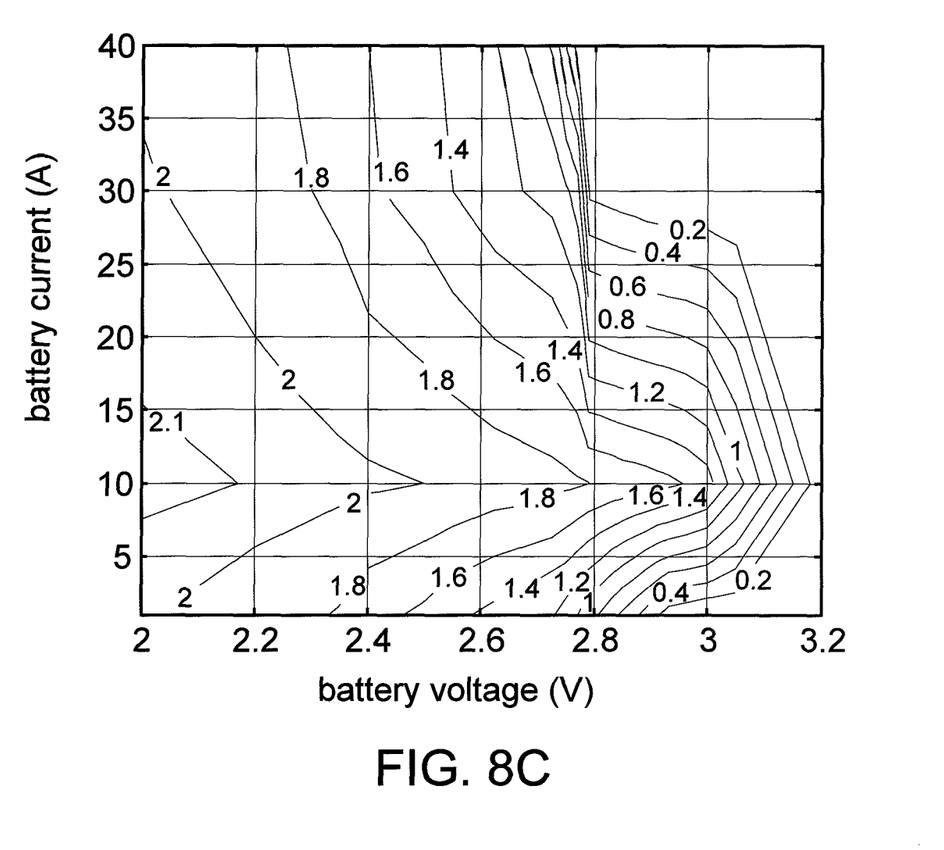

Vbat is the battery voltage; $V_{C,bat}$ is the voltage across the capacitor; $V_{S,bat}$ is the voltage across the resistor. If the Experiment data (as shown in FIG. 8A~8C) is taken into consideration, after the equation (1) is converted based on $R_{S,bat}$ and $C_{bat}$ non-linear function relationship, an equation (2) is obtained:

$$V_{C,bat} = V_{bat}(SOE_{bat}) - I_{bat}R_{S,bat} \quad (2)$$

$SOE_{bat}$ is the battery power status; $I_{bat}$ is the battery current; and $R_{S,bat}$ is an equivalent serial resistance of the battery.

In the equation (2), if $V_{C,bat}$ is expressed by a time domain function, then an equation (3) is obtained:

$$\left[\frac{1}{C_{bat}} \int i(t)dt + V_{C,bat}(0)\right] = V_{bat}(SOE_{bat}) - i(t)R_{S,bat} \quad (3)$$

$C_{bat}$ is an equivalent capacitance of the battery and $V_{C,bat}(0)$ is an initial battery voltage.

So, the battery equivalent capacitance is expressed as an non-linear function as following:

$$C_{bat} = \frac{\int i(t)dt}{V_{bat}(SOE_{bat}) - i(t)R_{S,bat} - V_{C,bat}(0)} \quad (4)$$

The SOC of the battery is related with the voltage across the capacitor $V_{C,bat}$, so the SOC is expressed as:

$$SOC_{bat}(t) = \frac{i(t) \times \left[\frac{1}{C_{bat}} \int i(t)dt + V_{C,bat}(0) - i(t)R_{S,bat}\right]}{\Delta E_{bat}} \times 100\% \quad (5)$$

wherein $\Delta E_{bat}$ is the rated battery power.

By so, SOC is estimated in the embodiment.

FIG. 8A~8C show the relationship between the battery voltage and the battery current at different battery power (0.2~2.2) under 300° K, 275° K and 255° K, respectively.

Figure 9:
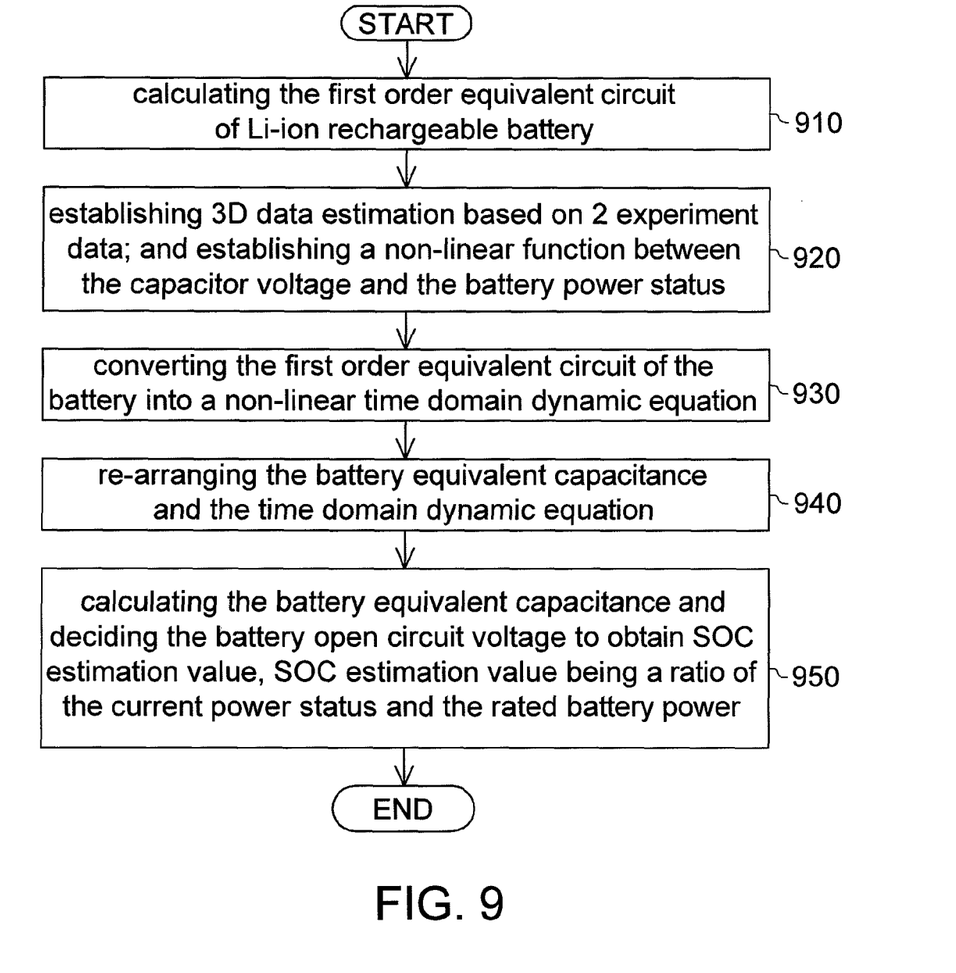
FIG. 9 shows a SOC estimation flowchart according to the embodiment of the disclosure.

FIG. 9 shows a SOC estimation flowchart according to the embodiment of the disclosure. In step 910, the first order equivalent circuit of Li-ion rechargeable battery is obtained, for example, by the equation (1). In the step 920, 3D data estimation is established based on the experiment data (for example but not limited to FIG. 8A~8C) via the fuzzy control; and a non-linear function between the capacitor voltage and the battery power status, for example by the above equation (2). In the step 930, the first order equivalent circuit of the battery is converted into a non-linear time domain dynamic equation, for example, by the above equation (3). In the step 940, the battery equivalent capacitance and the time domain dynamic equation are re-arranged, for example by the above equation (4). In the step 950, the battery equivalent capacitance is calculated and the battery open circuit voltage is decided, SOC being a ratio of the current power status and the rated battery power, for example by the above equation (5).

In summary, the improved Coulomb detection disclosed by the embodiment establishes a non-linear math model by the equivalent circuit concept, having the following characteristics: (1) the non-linear math model is established by the equivalent circuit concept and the experiment data is integrated into the SOC estimation; (2) the improved Coulomb detection disclosed by the embodiment is not hard to implement; and (3) the fuzzy control, the improved Coulomb detection and the open circuit voltage detection are combined in the SOC estimation.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A SOC (state of charge) estimation method applicable to a hardware battery control unit to control a rechargeable battery, applied in a battery management system of an electronic vehicle, comprising:
   measuring a battery parameter of the rechargeable battery;
   judging whether the battery parameter of the rechargeable battery is stable;
   if the battery parameter of the rechargeable battery is not stable, estimating a battery open circuit voltage of the rechargeable battery by a fuzzy control and processing an established experiment data of the rechargeable battery into a 3D (three dimensional) function by the fuzzy control; and
   calculating a time domain dynamic equation and converting into a SOC function, substituting the SOC function into the fuzzy control to estimate an SOC value, wherein the time domain dynamic equation performing a time domain dynamic monitor;
   wherein the step of judging whether the battery parameter of the rechargeable battery is stable comprises:
      during a predetermined period, judging whether the battery current of the rechargeable battery is smaller than a predetermined value and judging whether the battery voltage of the rechargeable battery is stable to judge whether the battery parameter of the rechargeable battery is stable; and
   the step of calculating the time domain dynamic equation comprises:
      calculating a first order equivalent circuit of the rechargeable battery;
      establishing a non-linear function of a capacitor voltage and a battery power status of the rechargeable battery based on the established experiment data of the rechargeable battery; and
      converting the first order equivalent circuit of the rechargeable battery into the time domain dynamic equation according to the non-linear function.

2. The method according to claim 1, further comprising:
   if the battery parameter of the rechargeable battery is stable, estimating the SOC value by an open circuit voltage detection.

3. The method according to claim 1, wherein the step of measuring the battery parameter of the rechargeable battery comprises:
   measuring a battery voltage, a battery current and a battery temperature of the rechargeable battery.

4. The method according to claim 3, wherein the fuzzy control includes:
   performing a fuzzy pre-procession on the battery voltage, the battery current and the battery temperature of the rechargeable battery based on a membership function;
   establishing a fuzzy rule base according to the established experiment data of the rechargeable battery; and
   performing a defuzzification based on the fuzzy rule base and the membership function.

5. The method according to claim 1, wherein the step of estimating the SOC value comprises:
   re-arranging the first order equivalent circuit of the rechargeable battery and the time domain dynamic equation; and
   calculating an equivalent capacitance of the rechargeable battery to decide a battery open circuit voltage of the rechargeable battery, the SOC value being a ratio of a current power status of the rechargeable battery and a rate battery power.

6. A battery control unit for controlling a rechargeable battery, the battery control unit applied in a battery management system of an electronic vehicle, the battery control unit comprising:
   an interface circuit, receiving a battery voltage and a battery temperature of the rechargeable battery;
   a current measurement circuit, measuring a battery current of the rechargeable battery; and
   a processing circuit, coupled to the interface circuit, estimating a SOC value of the rechargeable battery based on the battery voltage, the battery temperature and the battery current of the rechargeable battery, if the processing circuit judging the battery voltage, the battery temperature and/or the battery current of the rechargeable battery is not stable, the processing circuit estimating a battery open circuit voltage of the rechargeable battery by a fuzzy control and processing an established experiment data of the rechargeable battery into a 3D (three dimensional) function by the fuzzy control, the processing circuit calculating a time domain dynamic equation and converting into a SOC function, substituting the SOC function into the fuzzy control to estimate an SOC value, wherein the processing circuit performs a time domain dynamic monitor based on the time domain dynamic equation;
   during a predetermined period, the processing circuit judges whether the battery current of the rechargeable battery is smaller than a predetermined value and judges whether the battery voltage of the rechargeable battery is stable to judge whether the battery voltage and the battery current of the rechargeable battery are stable; and
   the processing circuit calculates a first order equivalent circuit of the rechargeable battery, the processing circuit establishes a non-linear function of a capacitor voltage and a battery power status of the rechargeable battery based on the established experiment data of the rechargeable battery, and the processing circuit converts the first order equivalent circuit of the rechargeable battery into the time domain dynamic equation according to the non-linear function.

7. The battery control unit according to claim 6, wherein if the processing circuit judges that the battery voltage, the battery temperature and the battery current of the rechargeable battery are stable, the processing circuit estimates the SOC value by an open circuit voltage detection.

8. The battery control unit according to claim 6, wherein:
   the processing circuit performs a fuzzy pre-procession on the battery voltage, the battery current and the battery temperature of the rechargeable battery based on a membership function;

the processing circuit establishes a fuzzy rule base according to the established experiment data of the rechargeable battery; and the processing circuit performs a defuzzification based on the fuzzy rule base and the membership function.

9. The battery control unit according to claim 6, wherein the processing circuit re-arranges the first order equivalent circuit of the rechargeable battery and the time domain dynamic equation; and the processing circuit calculates an equivalent capacitance of the rechargeable battery to decide a battery open circuit voltage of the rechargeable battery, the SOC value being a ratio of a current power status of the rechargeable battery and a rate battery power.

* * * * *